(12) United States Patent
El-Kareh

(10) Patent No.: US 8,530,952 B2
(45) Date of Patent: Sep. 10, 2013

(54) SYSTEMS, METHODS AND DEVICES FOR A MEMORY HAVING A BURIED SELECT LINE

(75) Inventor: Badih El-Kareh, Cedar Park, TX (US)

(73) Assignee: Micron Technology, Inc., Boise, ID (US)

( * ) Notice: Subject to any disclaimer, the term of this patent is extended or adjusted under 35 U.S.C. 154(b) by 1370 days.

(21) Appl. No.: 11/895,505

(22) Filed: Aug. 23, 2007

(65) Prior Publication Data

US 2009/0052258 A1    Feb. 26, 2009

(51) Int. Cl.
*H01L 29/788* (2006.01)

(52) U.S. Cl.
USPC ........... 257/319; 257/314; 257/315; 257/316; 257/324; 257/506; 257/E29.3; 257/E29.309

(58) Field of Classification Search
USPC ............... 257/314–324, 506, E29.3, E29.309
See application file for complete search history.

(56) References Cited

U.S. PATENT DOCUMENTS

| 5,751,037 | A  | * | 5/1998 | Aozasa et al. ................. 257/315 |
| 6,197,639 | B1 | * | 3/2001 | Lee et al. ....................... 438/258 |
| 6,252,275 | B1 |   | 6/2001 | Aitken et al. |
| 2008/0084745 | A1 | * | 4/2008 | Walker ....................... 365/185.17 |

OTHER PUBLICATIONS

Jung, Tae-Sung et al., "A 117-mm² 3.3-V Only 128-Mb Multilevel NAND Flash Memory for Mass Storage Applications", IEEE J. Solid-State Circuits, vol. 31, No. 11, Nov. 1996, pp. 1575-1583.
Lee, Yong Kyu et al., "Twin SONOS Memory With 30-nm Storage Nodes Under a Merged Gate Fabricated With Inverted Sidewall and Damascene Process", IEEE Electron Device Letters, vol. 25, No. 5, May 2004, pp. 317-319.

* cited by examiner

*Primary Examiner* — Allison P Bernstein
(74) *Attorney, Agent, or Firm* — Dorsey & Whitney LLP

(57) ABSTRACT

Memory cells and methods for programming and erasing a memory cell by utilizing a buried select line are described. A voltage potential may be generated between a source-drain region and the buried select line region of the memory cell to store charge in a storage region between the source-drain and buried select line regions. The generated voltage potential causes electrons to either tunnel towards the buried storage region to store electrical charge or away from the buried storage region to discharge electrical charge.

19 Claims, 6 Drawing Sheets

SYSTEMS, METHODS AND DEVICES FOR A MEMORY HAVING A BURIED SELECT LINE

TECHNICAL FIELD

Embodiments of the present invention relate generally to integrated memory devices, and more specifically, in one or more embodiments, to decoupling program and erase operations from read operations by utilizing a buried select line to program or erase memory cells in non-volatile memory devices.

BACKGROUND

Flash memory and other non-volatile memories are structured to have an array of memory cells arranged in rows and columns. Each memory cell comprises a floating gate transistor, and similar to the field-effect transistor, has a control gate, a source region and a drain region. The source region is separated from the drain region by a channel region, but unlike the field-effect transistor, a floating gate typically made of doped polysilicon is disposed over the channel region and electrically isolated from the channel region by a thin insulating layer of gate oxide. The control gate is then formed over the floating gate, and separated by another layer of insulator. Therefore, the floating gate is insulated from the channel, the control gate and all other components of the flash memory cell, thus "floating."

The flash memory cell can be programmed to store charge representing data, erase the stored charge to prepare for another program operation, or read the data in the programmed memory cell. The flash memory cell is programmed by storing charge on the floating gate, which thereafter remains on the gate for an indefinite period. Charge is stored on the floating gate by applying appropriate voltages to the control gate and the drain region or the source region. An electrical charge may be stored in the floating gate by a number of different ways. For example, programming can be performed by channel hot-electron injection (CHE), where a sufficiently large positive bias is applied to the control gate while the source is grounded to attract electrons through the gate oxide and into the floating gate region. The voltage applied to the control gate, called the programming voltage, determines the amount of charge to store on the floating gate. Before programming, the flash memory cell is generally erased by removing any charge trapped in the floating gate. An erase voltage is applied to the control gate to generate a gate voltage having a polarity opposite to that used in the programming operation. For example, in a process called drain-Fowler-Nordheim (FN) tunneling, a relatively large negative bias is applied on the control gate and a positive bias is applied to the drain region to cause the electrons to tunnel towards the drain through the gate oxide and deplete any charge from the floating gate.

After a memory cell has been programmed, the flash memory cell may be read by applying a positive control gate to source voltage, called read voltage. The amount of charge stored on the flash memory cell determines the magnitude of the threshold voltage that must be applied to the control gate to allow the flash memory cell to conduct current between the source and the drain. The source is coupled to ground, and a suitable positive voltage is applied to the drain, which is used as the output terminal of the cell. As negative charge is added to the floating gate, the threshold voltage of the flash memory cell increases. During a read operation, the read voltage applied to the control gate must be large enough to render the cell conductive if no charge is stored on the floating gate, but not large enough to render the cell conductive if charge is stored on the floating gate. Therefore, if the floating gate of the flash memory cell is charged, the drain will remain at the positive voltage and output a "1" value. If the floating gate of the flash memory cell is not charged, the cell will ground the drain and output a "0" value.

Two types of flash memory array architectures are the "NAND" and "NOR" architectures, so called for the logical form in which the basic flash memory cell configuration for each is arranged. FIG. 1 illustrates a typical NOR flash memory array 10 of conventional design. The array 10 includes memory cells 18 arranged in rows and columns. The drains of the memory cells 18 of a single column are coupled to each other in series by a common bitline 20 (BL-1 to BL-3), and the gates of the memory cells 18 of a single row are coupled to each other by a common select line 30 (WL-1 to WL-3). The sources of the memory cells 18 in the array are additionally coupled to an array source 40.

The read operation is performed on a row-by-row basis, where the read voltage is applied to a selected select line 30, thereby applying the read voltage to the control gates of all the memory cells in that row. The array source 40 is coupled to ground and the bitline 20 for each column is precharged to a supply voltage VCC, such that if the gate to source voltage of each memory cell 18 of the selected row is greater than the threshold voltage, the channel region of the memory cell 18 will become conductive. However, since charge must be transported through the gate oxide during programming and erase operations, memory cell 18 will get some incremental damage over time, eventually making it difficult to properly distinguish between a "1" and a "0". This limits the number of program/erase cycles to typically 1 million.

FIG. 2 is a block diagram illustrating the formation of a prior art metal oxide semiconductor flash memory cell 200 having a floating gate 212. The flash memory cell 200 includes a control gate 230 formed over the floating gate 212. Both the control gate 230 and the floating gate 212 are deposited using a standard polysilicon layer, except the floating gate 212 is encapsulated by a dielectric material (not shown). The control gate 230 is connected to the select line 30 of FIG. 1, and is separated from the floating gate 212 by an insulator 232 of appropriate material and thickness. A thin layer of gate oxide 233 separates the floating gate 212 from the silicon surface of a channel region 225, which is formed by doping commercially available silicon material. The channel region 225 separates a source region 214 and a drain region 216, which are also formed by appropriately doping the silicon layer, and may be either p-type or n-type depending on the transistor-type of the memory cell 200. The source and drain regions 214, 216 are isolated from the source and drain regions of adjacent memory cells by shallow trenches 220, that are formed by depositing one of several types of dielectric material known in the art.

As the control gate 230 is subjected to high voltage levels during every program and erase operation (either by CHE or FN tunneling), the silicon surface of the memory cell 200 body and the gate oxide layers 233 between the gates 212, 230 are incrementally damaged due to hot electrons that are induced by the higher voltage levels. Charges may be trapped at the silicon-oxide interface and within the gate oxide layers 233. As the electrons become heated by the high energy fields, their kinetic energy increases, causing the electrons to bombard the silicon-oxide interface, and become trapped. Consequently, the damage to the oxide layers 233 and silicon surface gradually changes the properties of the memory cell 200 so much that the memory cell's 200 threshold voltage may be modified. The damaged interface and the oxide layers 233 may also cause charge to leak from the control gate 230, the floating gate 212 or the channel region 225 due to one or more of the oxide layers 233 deteriorating due to trapped electrons. The read voltage level applied to the control gate 230 may become insufficient to carry out a proper read operation as the properties of the memory cell 200 are altered. Eventually, it becomes difficult to distinguish the different threshold voltage levels of the memory cell 200 during a read operation. Additionally, the type of gate oxide and the thickness of the gate oxide layer are limited to certain materials, known in the art, that must achieve the particularized threshold voltage while withstanding the damage to the control gate 230 in order to meet industry standard program/erase cycles during the life of the cell.

There is, therefore, a need to, for example, avoid damaging effects of the higher voltage levels on the control gate.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 2:
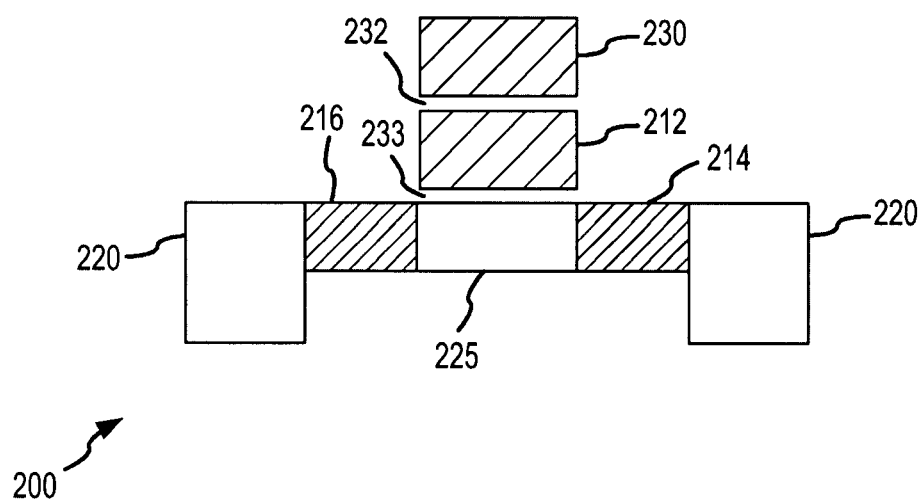
FIG. 2 is a block diagram illustrating the formation of a prior art metal oxide semiconductor flash memory cell that includes a floating gate.
Figure 3:
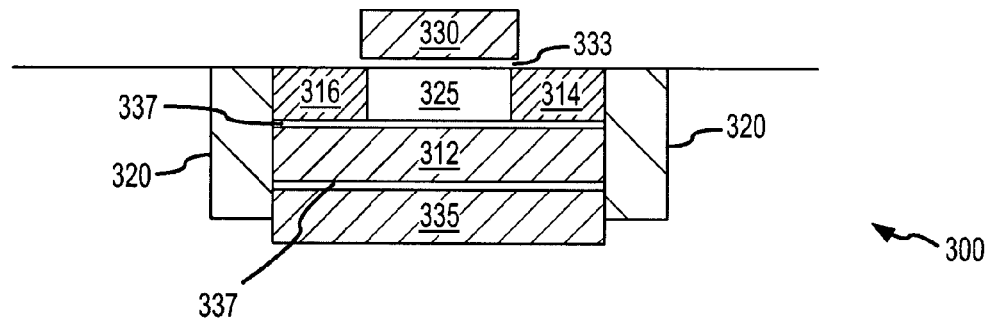
FIG. 3 is a block diagram showing the formation of a semiconductor flash memory cell according to an embodiment of the invention.

FIG. 3 is a block diagram showing the structure of a metal oxide semiconductor field-effect transistor in a flash memory cell 300 according to an embodiment of the invention. A gate node, such as a gate 330, is disposed over a channel, such as the channel region 325, separated by a thin layer of oxide 333. Similar to the memory cell 200 of FIG. 2, the memory cell 300 includes a channel region 325 between a pair of nodes, such as source region 314 and an access node, such as a bitline which in the illustrated embodiment comprises region 316, each of the regions are formed by an appropriate doping of the silicon layer. The memory cell 300 further includes a storage material, such as that found in storage film region 312 which might be formed by a heavily doped silicon layer, which is positioned below the channel region 325, the source region 314 and the bitline/drain region 316. The storage film region 312 functions similarly to the floating gate 212 of FIG. 2, and is capable of storing charge to alter the threshold voltage of the memory cell 300. The storage film region 312 is fully encapsulated by insulator materials to prevent stored charge from leaking by thin layers of dielectric material 337 above and below the region 312, and a thick dielectric-filled trench 320 to the left and right of the region 312.

The memory cell 300 also includes a gate/select node, such as buried select line region 335, formed below the storage film region 312 and separated by a buried oxide layer 337. The buried select line region 335 in each cell 300 of a row of memory cells may be contiguously coupled together by a common node, thereby forming a select line (e.g., wordline) that is parallel to an other select node, such as the select line (e.g., wordline) formed by the gates 330. During a programming operation, the bitline region 316 may be negatively biased with respect to the selected buried select line region 335 in a manner such that a positive potential is created towards the buried select line region 335, and electrons are forced to tunnel through the buried oxide layer 337 (below the bitline region 316) into the storage film 312. A predetermined charge may be stored in the storage film region 312 to 'program' the memory cell 300 to hold a "1" or a "0" value as previously described. The memory cell 300 may be erased by reversing the polarity between the bitline region 316 and the buried select line region 335, whereby electrons stored in the storage film region 312 are tunneled towards the bitline region 316 to discharge. It will be appreciated that although embodiments describe biasing the bitline region 316 for programming and erase operations, the source region 314 or the channel region 325, if properly connected, may alternatively be biased to store or erase charge in the storage film region 312, as known in the art. By performing programming and erase operations using the buried select line region 335, the damaging effects of a high voltage on the gate oxide 333 and its interface with silicon is avoided. The high voltage damage is instead displaced to the thin dielectric material 337 formed between the storage film 312 and the buried select line 335, where no critical read operations are performed. While programming and erase operations are important functions of the memory cell 300, read operations are the baseline for determining the life of the cell. Once the oxide layer 333 is permanently damaged the memory cannot be reliably read. By decoupling programming and erase operations from read operations, properties of the memory cell 300, such as the threshold voltage, are better retained because the oxide layer 333 is no longer damaged, resulting in a longer life for the memory cell 300.

Having the buried select line region 335 also allows for greater flexibility in how the oxide layer 333 can be formed. The thickness of the oxide layer 333 between the gate 330 and the channel region 325 may be varied without factoring in the trade-off due to the damage. The oxide layer 333 may also be formed using any dielectric material, known in the art, such as hafium oxide, hafium silicon oxynitride, and other high-k dielectrics that provide greater versatility in performance, but previously were not made available to flash memory due to the higher density of electron trapping in these materials. Because programming and erase operations are decoupled from read operations, their high voltages should have no effect on the oxide layer 333, allowing for more flexibility in the materials used to form the oxide layer 333.

Figure 4:
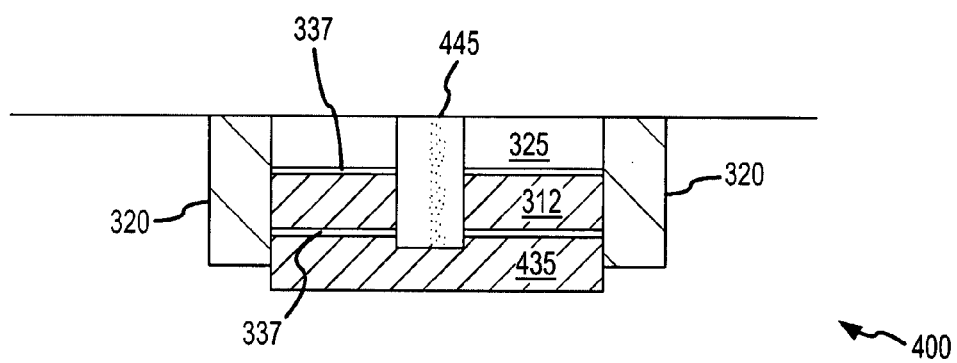
FIG. 4 is a block diagram showing the formation of a semiconductor flash memory cell according to another embodiment of the invention.

The buried select line region 335 of all the memory cells 300 in a row of the memory array may be connected in any number of ways to form the buried select line. One such way is illustrated in FIG. 4, showing a block diagram of a disabled memory cell at the end of the row that is convert into a contact node 400 for contacting the buried select line. The contact node 400 is similarly structured to and share some of the same features as the memory cell 300 of FIG. 3 since the last memory cell in the row is utilized. In the interest of brevity, these common features have been provided with the same reference numbers and are not described. Memory cells 300 in a typical row may be positioned adjacent to each other in a manner such that the respective buried select line regions 335, 435 are formed as a contiguous layer of doped silicon. The contact node 400 in the row may then be structured to provide a conducting material 445 (such as a metal contact or doped polysilicon) to all the buried select line regions 335, 435 in the row, whereby the conducting material 445 is deposited vertically through the various layers of the contact node 400 to the buried select line region 435. The contact node 400 is physically disabled by not patterning the gate 330 (as shown in FIG. 3) to the last memory cell in the row.

Figure 5:
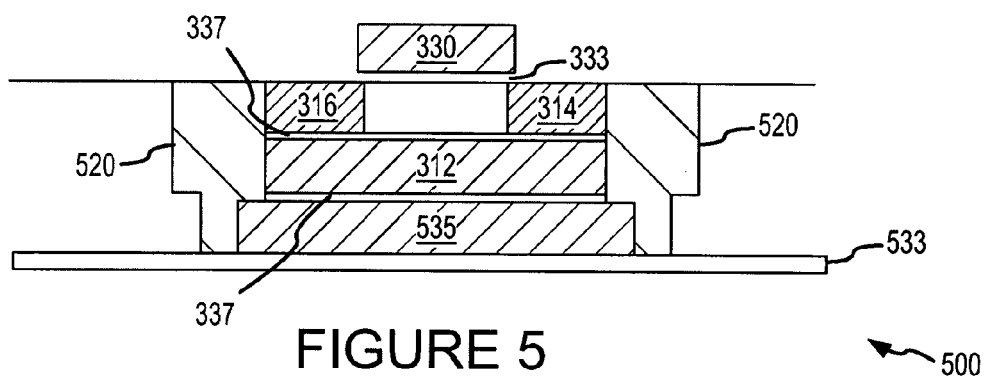
FIG. 5 is a block diagram showing the formation of a semiconductor flash memory cell according to another embodiment of the invention.

Alternatively, a buried select line region 535 may be electrically isolated from buried select line regions of adjacent memory cells by a deeper dielectric-filled trench, such as a dielectric-filled double trench 520, as shown by the block diagram of FIG. 5. By fully isolating each memory cell 500, cross-talk between the buried select line regions 535 and other interferences may be eliminated. The dielectric-filled double trench 520 may be deposited to extend to an insulating layer 533 at the base of the memory cell 500, such as the insulating layer of a silicon-on-insulator (SOI) material that may have been used to form the memory cell 500, thereby encapsulating the entire memory cell 500 with insulating material. The buried select line regions 535 may be connected by a common node at the end of the row or array, as previously described. It remains continuous along the select line.

Figure 1:
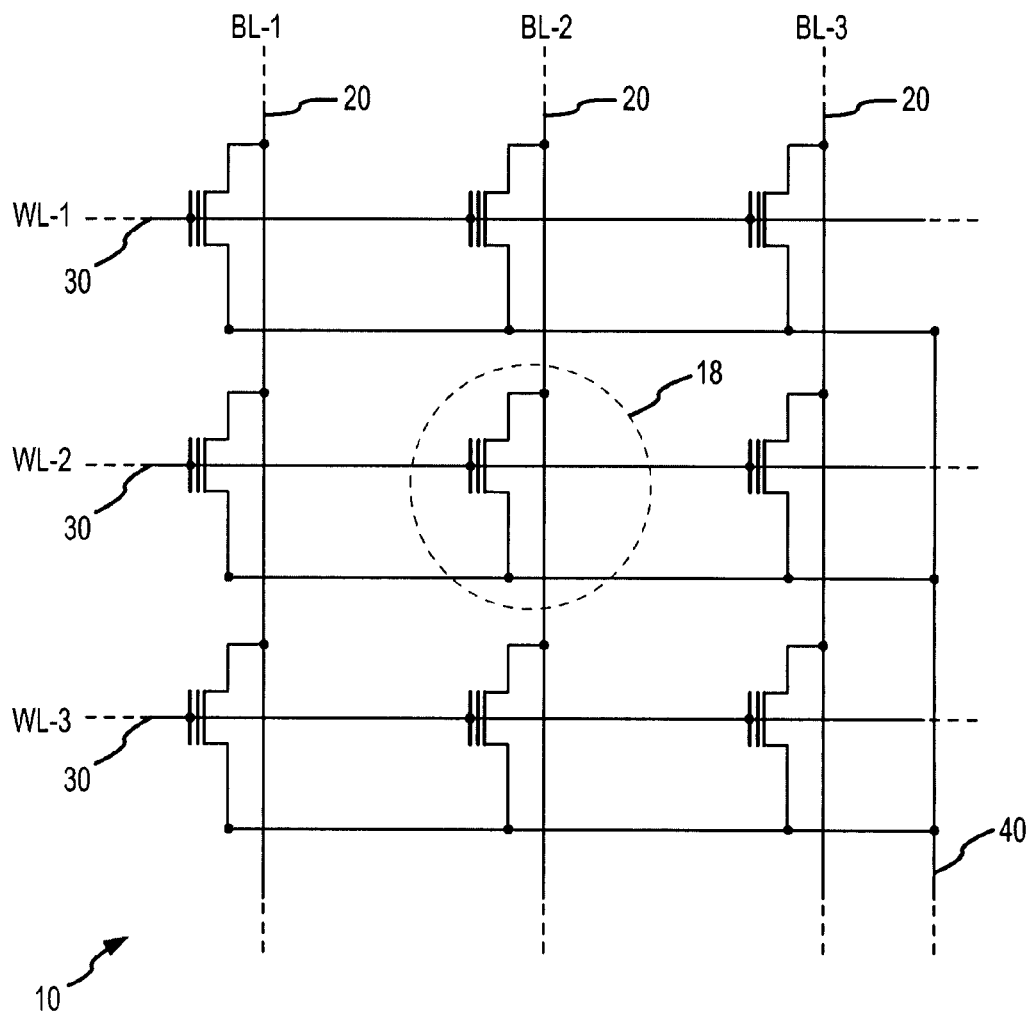
FIG. 1 is a schematic diagram showing a conventional NOR array of flash memory cells.
Figure 6:
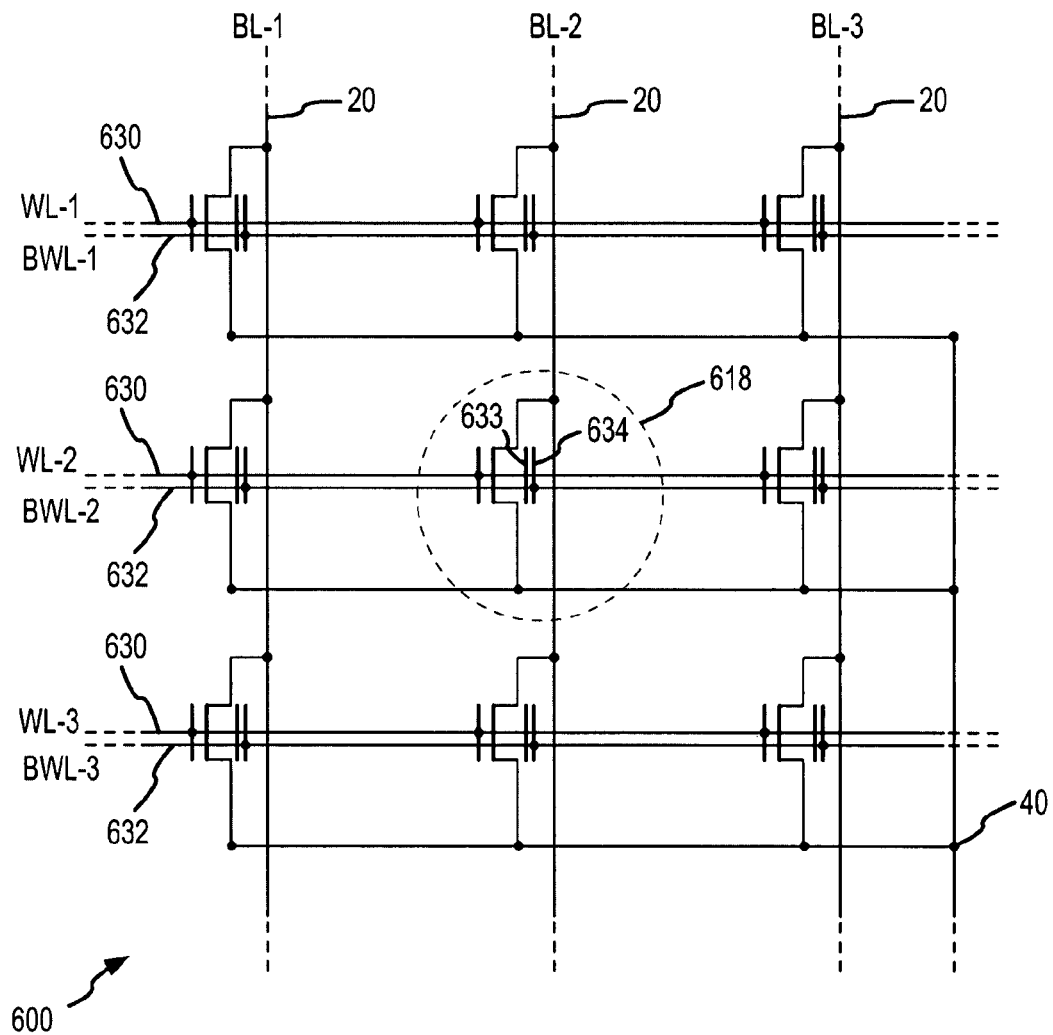
FIG. 6 is a schematic diagram showing a NOR array of flash memory cells of FIG. 2, according to an embodiment of the invention.

FIG. 6 is a schematic diagram showing a NOR flash memory array 600 that includes a buried select line 632 in each row according to embodiments of the invention. The NOR flash memory array 600 includes many of the same elements as the NOR flash memory array 10 of FIG. 1, and in the interest of brevity, these common elements have been provided with the same reference numbers, and will not described again. In contrast to the NOR flash memory array 10, memory cells 618 in each row of the NOR flash memory array 600 include a buried select line region 634 that are coupled to each other to form the buried select line 632 (BWL-1 to BWL-3). Each row includes a gate 630 (WL-1 to WL-3) comprising of the gates 330 connected parallel to the buried select line 632, and therefore is perpendicular to the bitlines 20 (BL-1 to BL-3). As a result, a voltage potential may be generated between a selected buried select line 632 and the bitlines 20, providing access to buried storage film regions 633, thereby allowing the memory cells 618 of the array to be programmed or erased without utilizing the gate 630. The gate 630 may then be designated for read operations, which minimizes damage to the oxide layer 333, as previously described, and significantly extends the endurance of the memory cells 618.

Figure 7:
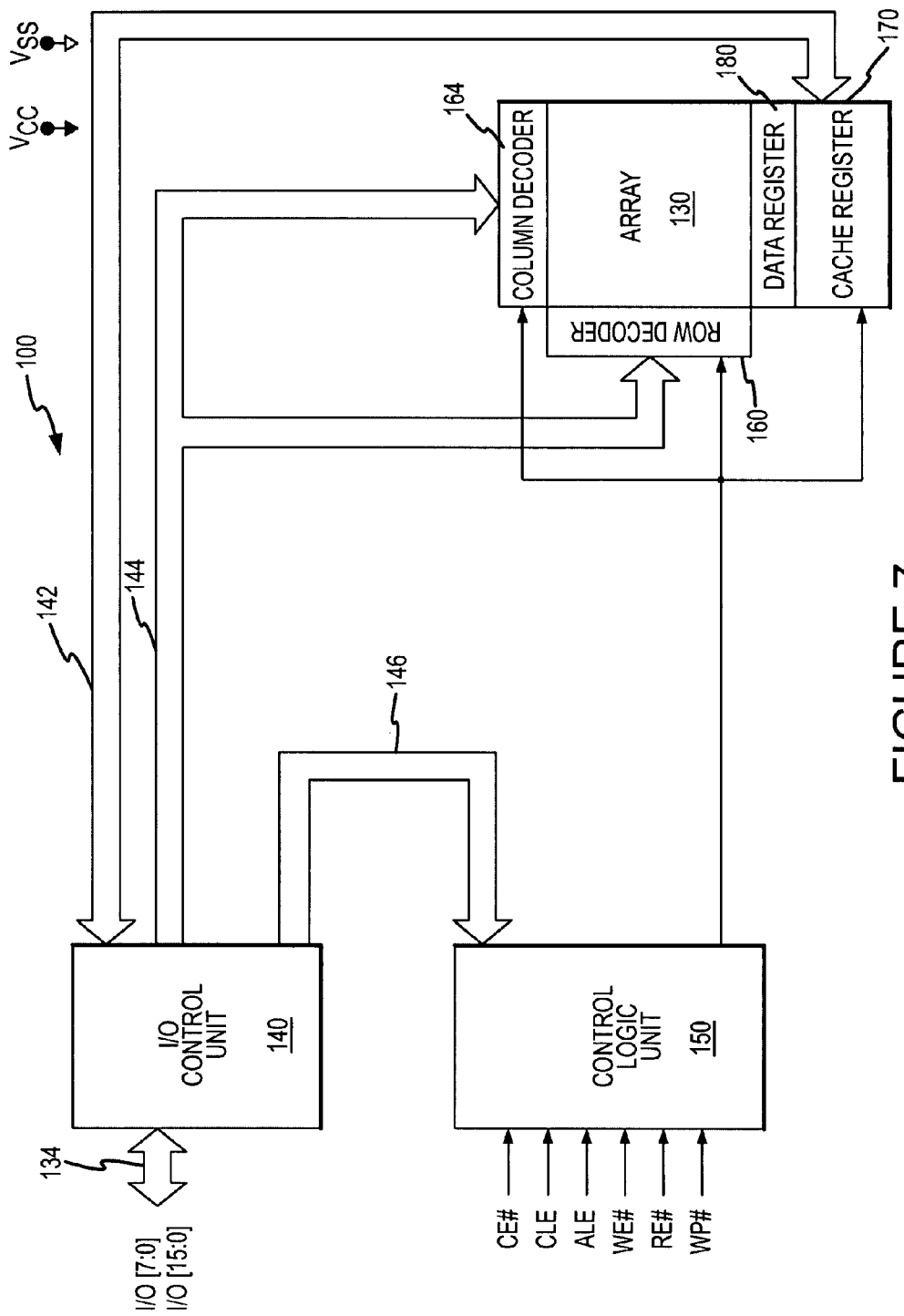
FIG. 7 is a block diagram showing a flash memory device having the NOR array of flash memory cells of FIG. 6 according to an embodiment of the invention.

A flash memory device 100 that includes an array of flash memory cells 130 according to an embodiment of the invention is shown in FIG. 7. The array 130 of flash memory cells are arranged in banks of rows and columns, wherein each row of the array 130 has a select line utilized during read operations and a separate buried select line utilized during programming and erase operations. Most command signals, the address signals and the programming signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an internal address bus 144, and an internal command bus 146. The flash memory device 100 also includes a control logic unit 150 that receives a number of control signals either externally or through the command bus 146 to control the operation of the memory device 100. The address bus 144 applies row address signals to a row decoder 160 and column address signals to a column decoder 164. The row decoder 160 asserts select lines corresponding to the decoded row address signals. Similarly, the column decoder 164 enables programming signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been applied to the address bus 144, the I/O control unit 140 routes programming signals to a cache register 170. The programming signals are stored in the cache register 170 in successive sets each having a size corresponding to the width of the I/O bus 134. The cache register 170 sequentially stores the sets of programming signals for an entire page (e.g., row) of flash memory cells in the array 130. All of the stored programming signals are then used to program a page of memory cells in the array 130 selected by the row address coupled through the address bus 144. In a similar manner, during a read operation, data signals from a page of memory cells selected by the row address coupled through the address bus 144 are stored in a data register 180. Sets of data signals corresponding in size to the width of the I/O bus 134 are then sequentially transferred through the I/O control unit 140 from the data register 180 to the I/O bus 134.

Figure 8:
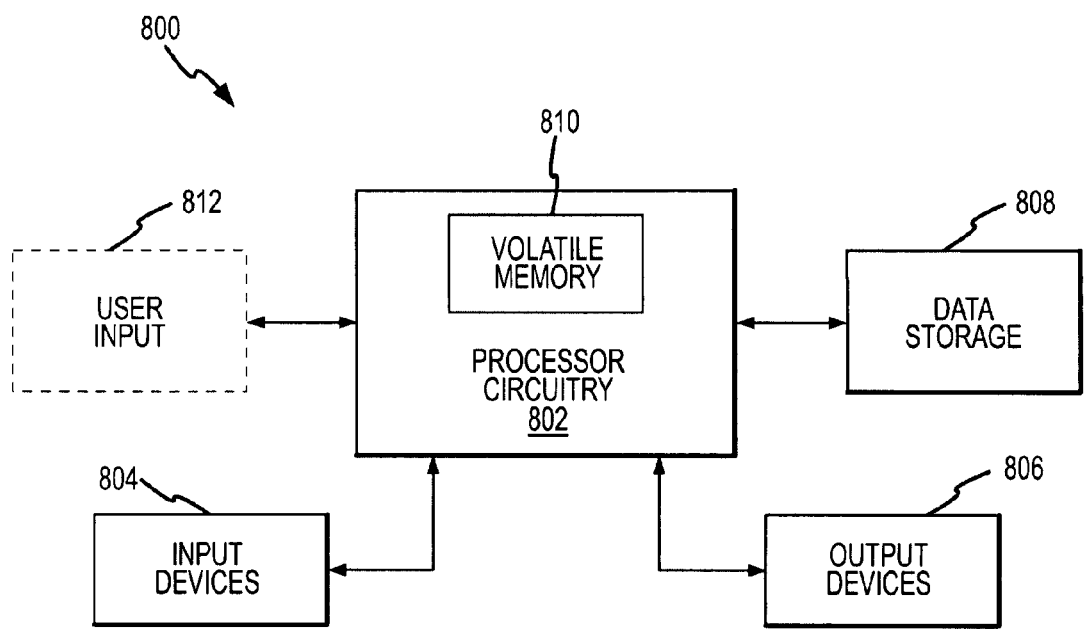
FIG. 8 is a block diagram of a processor-based system that includes the flash memory device of FIG. 7 according to an embodiment of the invention.

FIG. 8 is a block diagram of an embodiment of a processor-based system 800 that the memory device 100 of FIG. 7. Conventionally, the processor circuitry 802 is coupled through address, data, and control buses to a volatile memory device 810 to provide for writing data to and reading data from the volatile memory device 810. The processor circuitry 802 includes circuitry for performing various processing functions, such as executing specific software to perform specific calculations or tasks. In addition, the processor-based system 800 may include one or more input devices 804, such as a keyboard or a mouse, coupled to the processor circuitry 802 to allow an operator to interface with the processor-based system 800. Typically, the processor-based system 800 may also include one or more output devices 806 coupled to the processor circuitry 802, such as output devices typically include a printer and a video terminal. One or more data storage devices 808 are also typically coupled to the processor-based circuitry 802 to store data or retrieve data from external storage media (not shown). Examples of typical storage devices 808 include hard and floppy disks, tape cassettes, compact disk read-only ("CD-ROMs") and compact disk read-write ("CD-RW") memories, and digital video disks ("DVDs"). Data storage devices 808 may also include non-volatile memory devices to store data that is to be retained even when power is not supplied to the processor-based system 800 or the data storage devices 808, such as a flash memory device (not shown) according to some other examples of the invention. The non-volatile memory devices, may include memory arrays structured to have buried select lines, such as one or more of the embodiments described above.

FIG. 8 may alternatively be a block diagram of a consumer device, such as a cell phone, digital camera or other hand-held device, having a user input 812 coupled to the processor 802. The processor 802 may be a microprocessor, digital signal processor, or part of a central processing unit that communicates with the user input 812 over a bus. The processor 802 may additionally have a random access memory (RAM) or, alternatively, the user input 812 may include the RAM to which the processor communicates over the bus. The user input 812 may additionally include a non-volatile storage device such as flash memory, or rely on the data storage device 808.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory cell of an array of memory cells in a memory device, comprising:
   a storage region operable to store an electrical charge;
   a pair of nodes each node capable of being respectively coupled to a voltage source;
   a channel extending between the pair of nodes;
   a select region including a gate node below the channel and capable of being coupled to a gate voltage source, the gate node operable to generate a voltage potential below the channel responsive to being coupled to the gate voltage source;
   a first dielectric-filled double trench including an upper portion formed adjacent a first end of the storage region and including a lower portion formed adjacent a first end of the select region, wherein the upper and lower portions of the first dielectric-filled double trench having different widths; and
   a second dielectric-filled double trench including an upper portion formed adjacent a second end of the storage region and including a lower portion formed adjacent a second end of the select region, wherein the upper and lower portions of the second dielectric-filled double trench having different widths.

2. The memory cell of claim 1 wherein the gate node is operable to generate a first voltage potential to store electrical charge below the channel and a second voltage potential to discharge electrical charge stored below the channel.

3. The memory cell of claim 1 further comprising a storage material between the channel and the gate node, wherein the storage material is isolated from the channel and the gate node by a dielectric layer.

4. The memory cell of claim 1 further comprising a second gate node above the channel and coupled to a second voltage source, wherein the gate node below the channel is accessed during at least one of a program or erase operation of the memory cell and the gate node above the channel is accessed during a read operation of the memory cell.

5. The memory cell of claim 4 wherein the second gate node is isolated from the channel by a high-k dielectric material.

6. A memory cell of an array of memory cells in a memory device, comprising:
   a doped region configurable to receive a first bias;
   a storage region formed below the doped region and having first and second ends, and operable to store an electrical charge;
   a first dielectric-filled trench adjacent the first end of the storage region and having a first width;
   a second dielectric-filled trench adjacent the second end of the storage region and having, a second width;
   a third dielectric-filled trench formed below the first dielectric-filled trench, wherein the third dielectric-filled trench has a third width less than the first width;
   a fourth dielectric-filled trench formed below the second dielectric-filled trench, wherein the fourth dielectric-filled trench has a fourth width less than the second width; and
   a select region formed below the storage region and extending from the third dielectric-filled trench to the fourth dielectric-filled trench, the select region configurable to receive a second bias and operable to generate a voltage potential that tunnels electrons either towards the storage region or away from the storage region.

7. The memory cell of claim 6 wherein the select region stores an electrical charge in the storage region responsive to a positive voltage potential during a programming operation, wherein the stored electrical charge changes the threshold voltage of the memory cell.

8. The memory cell of claim 7 wherein the select region discharges an electrical charge from the storage region responsive to a negative voltage potential during an erase operation.

9. The memory cell of claim 6 wherein the first and third dielectric-filled trenches extend vertically between the memory cell and an adjacent memory cell up to the select region.

10. The memory cell of claim 6 wherein the select region is contiguously connected to a select region of an adjacent memory cell, and wherein the contiguously connected select regions are coupled to a common node.

11. The memory cell of claim 10 wherein the select region contiguously connected to the select region of the adjacent memory cell comprises forming a continuous layer of polysilicon.

12. The memory cell of claim 6 wherein the memory cell is formed on top of an insulating base layer and wherein the first and third, and second and fourth dielectric-filled trenches extend vertically to the insulating base layer to fully encapsulate the memory cell with dielectric material.

13. The memory cell of claim 6 further comprising a control gate region formed above the doped region having a dielectric layer separating the control gate region from the doped region, wherein the dielectric layer is of a material that is different from a dielectric layer separating the storage region from the doped region, and the storage region from the select region.

14. The memory cell of claim 6 wherein the storage region comprises being formed by a heavily doped polysilicon layer.

15. A memory cell of an array of memory cells in a memory device, comprising:
   an access node coupling a column of memory cells and configured to receive a first voltage, and a select node coupling a row of memory cells and configured to receive a second voltage;
   a buried select node configured to receive a third voltage, the buried select node operable to generate a voltage potential between the access node and the buried select node responsive to receiving the third voltage;
   a first dielectric-filled trench adjacent a first end of the buried select node and a second dielectric-filled trench adjacent a second end of the buried select node, wherein the first dielectric-filled trench has a first width and the second dielectric-filled trench has a second width;

a third dielectric-filled trench formed above the first dielectric-filled trench and having a third width greater than the first width;

a fourth dielectric-filled trench formed above the second dielectric-filled trench. and having a fourth width greater than the second width; and a buried storage region in each of the memory cells of the array, the buried storage region between the access node and the buried select node and encapsulated at least in part by the third and fourth dielectric-filled trenches, the buried storage region operable to store electrical charge responsive to a positive voltage potential being generated, and discharge electrical charge responsive to a negative voltage potential being generated.

16. The memory cell of claim 15 wherein the buried select node comprises a common select node being connected to buried select line regions of each memory cell in the row of memory cells.

17. The memory cell of claim 16 wherein the common select node comprises a metal contact connected to the buried select line region of a last memory cell in the row.

18. The memory cell of claim 17 wherein the buried select line regions connected in the row of memory cells is formed parallel to the select node coupling the row of memory cells.

19. The memory cell of claim 15 wherein the select node is utilized to perform a read operation and the buried select node is utilized to perform at least one of a programming or erase operation.

* * * * *

UNITED STATES PATENT AND TRADEMARK OFFICE
CERTIFICATE OF CORRECTION

| | |
|---|---|
| PATENT NO. | : 8,530,952 B2 |
| APPLICATION NO. | : 11/895505 |
| DATED | : September 10, 2013 |
| INVENTOR(S) | : Badih El-Kareh |

It is certified that error appears in the above-identified patent and that said Letters Patent is hereby corrected as shown below:

In the Claims

In column 9, line 8, in Claim 15, delete "trench." and insert -- trench --, therefor.

Signed and Sealed this
Twenty-sixth Day of November, 2013

Margaret A. Focarino
*Commissioner for Patents of the United States Patent and Trademark Office*